(12) United States Patent
Tsai et al.

(10) Patent No.: US 12,501,536 B2
(45) Date of Patent: Dec. 16, 2025

(54) OPTICAL ENGINE MODULE

(71) Applicant: Coretronic Corporation, Hsin-Chu (TW)

(72) Inventors: Te-Ying Tsai, Hsin-Chu (TW); Ken-Teng Peng, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 115 days.

(21) Appl. No.: 17/889,400

(22) Filed: Aug. 17, 2022

(65) Prior Publication Data

US 2023/0055542 A1 Feb. 23, 2023

(30) Foreign Application Priority Data

Aug. 23, 2021 (CN) .......................... 202110966270.8

(51) Int. Cl.
*H05K 1/02* (2006.01)
*H05K 7/20* (2006.01)

(52) U.S. Cl.
CPC ......... *H05K 1/0203* (2013.01); *H05K 7/2039* (2013.01)

(58) Field of Classification Search
CPC .. H05K 1/0274; H05K 1/0203; H05K 7/2039; H05K 7/20409; H05K 7/20436; H05K 7/205; H05K 7/20509; H05K 2201/10121
See application file for complete search history.

(56) References Cited

U.S. PATENT DOCUMENTS

| | | | | |
|---|---|---|---|---|
| 6,791,838 B1 * | 9/2004 | Hung | .................. | H01L 23/4006 174/16.3 |
| 7,938,543 B2 | 5/2011 | Gerets et al. | | |
| 8,988,883 B2 * | 3/2015 | Miyashita | .......... | H05K 7/20963 361/728 |

(Continued)

FOREIGN PATENT DOCUMENTS

| CN | 110388615 | 10/2019 |
|---|---|---|
| CN | 111108438 | 5/2020 |

(Continued)

OTHER PUBLICATIONS

"Office Action of China Counterpart Application", issued on May 9, 2025, p. 1-p. 9.

*Primary Examiner* — Jayprakash N Gandhi
*Assistant Examiner* — Matthew Sinclair Muir
(74) *Attorney, Agent, or Firm* — JCIPRNET

(57) ABSTRACT

An optical engine module including a circuit board, a light valve module, a thermal conductive member, and a supporting member is provided. The circuit board having a first surface, a second surface opposite to the first surface, a first opening hole and at least one second opening hole. The light valve module is disposed on the first surface and electrically connected to the circuit board. The thermal conductive member is disposed on the second surface of the circuit board and is connected to a back surface of the light valve module through the first opening hole of the circuit board. A supporting member is disposed on one side of the first surface of the circuit board. The supporting member is partially in contact with the light valve module, and is connected to the thermal conductive member through the at least one second opening hole of the circuit board.

12 Claims, 7 Drawing Sheets

(56) References Cited

U.S. PATENT DOCUMENTS

| | | | |
|---|---|---|---|
| 10,007,137 B2 * | 6/2018 | Matsumaru | H01L 31/024 |
| 10,599,023 B2 * | 3/2020 | Tang | G03B 21/16 |
| 10,705,415 B2 * | 7/2020 | Dong | G02B 7/028 |
| 11,126,071 B2 * | 9/2021 | Van Rafelghem | G03B 21/008 |
| 2004/0174679 A1 | 9/2004 | Hung et al. | |
| 2019/0056080 A1 * | 2/2019 | Mayer | F21S 45/47 |
| 2020/0150382 A1 * | 5/2020 | Yang | G03B 21/008 |
| 2020/0341357 A1 | 10/2020 | Tsai et al. | |
| 2022/0365411 A1 * | 11/2022 | Tsai | G03B 21/16 |
| 2023/0089340 A1 * | 3/2023 | Fang | G02B 26/0833 |
| | | | 136/204 |
| 2023/0350280 A1 * | 11/2023 | Li | G03B 21/008 |

FOREIGN PATENT DOCUMENTS

| | | |
|---|---|---|
| CN | 111175967 | 5/2020 |
| WO | 2021151233 | 8/2021 |

\* cited by examiner

OPTICAL ENGINE MODULE

CROSS-REFERENCE TO RELATED APPLICATION

This application claims the priority benefit of China application serial no. 202110966270.8, filed on Aug. 23, 2021. The entirety of the above-mentioned patent application is hereby incorporated by reference herein and made a part of this specification.

BACKGROUND

Technical Field

The disclosure relates to a display device, and more particularly, to an optical engine module suitable for a projector.

Description of Related Art

Conventional projectors mostly use high-pressure mercury lamps as light sources. In recent years, with the advancement in semiconductor manufacturing processes, light sources formed by semiconductor components such as light emitting diodes or laser diodes have been developed. The light sources formed by the semiconductor components have the advantages such as small volume and high brightness of the light source. Therefore, as the demand for the brightness of the projector increases, the operating temperature of the light valve module is bound to rise, causing the light valve module to be damaged due to the large temperature difference between the front and back ends of the light valve module.

In addition, in order for the temperature difference between the front and back ends of the light valve module to meet the specifications (for example, less than or equal to 10° C.), a thermal dissipation element or a thermal dissipation module is generally disposed at the front end of the light valve module, such as a thermoelectric cooler (TE cooler) or a water-cooled thermal dissipation module. However, this type of design will increase the distance between the light valve module and the optical element, causing difficulties in the design of the optical path and system miniaturization. In addition, the thermal dissipation structures of the front end and the back end of the light valve module are generally designed separately, which will further increase the production cost.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides an optical engine module. The optical engine module has a light valve module, which may prevent the light valve module from being damaged due to a large temperature difference between a light emitting side and a back side of the light valve module, and further has better integration and cost merit.

An optical engine module of the disclosure includes a circuit board, a light valve module, a thermal conductive member, and a supporting member. The circuit board has a first surface, a second surface opposite to the first surface, a first opening hole and at least one second opening hole. The first opening hole penetrates through the first surface and the second surface and the at least one second opening hole penetrates through the first surface and the second surface. The light valve module is disposed on the first surface and electrically connected to the circuit board. The light valve module has a light emitting surface and a back surface opposite to the light emitting surface. The thermal conductive member is disposed on the second surface of the circuit board, and is connected to the back surface of the light valve module through the first opening hole of the circuit board. The supporting member is disposed on one side of the first surface of the circuit board. The supporting member is partially in contact with the light valve module, and is connected to the thermal conductive member through the at least one second opening hole of the circuit board.

Based on the above, in the optical engine module according an embodiment of the disclosure, the thermal conductive member is disposed on one side of the circuit board facing away from the light valve module, and is in thermal contact with the back surface of the light valve module through the first opening hole of the circuit board. In order to reduce the temperature difference between the light emitting side and the back side of the light valve module, the supporting member located on the light emitting side of the light valve module is in thermal contact with the thermal conductive member through the second opening hole of the circuit board. The light emitting side and the back side of the light valve module is cooled by the same thermal conductive member. Therefore, the space occupied by the thermal dissipation structure on the light emitting side of the light valve module may be reduced, which helps to reduce the complexity of the design of the optical path and the production cost of the whole optical engine.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
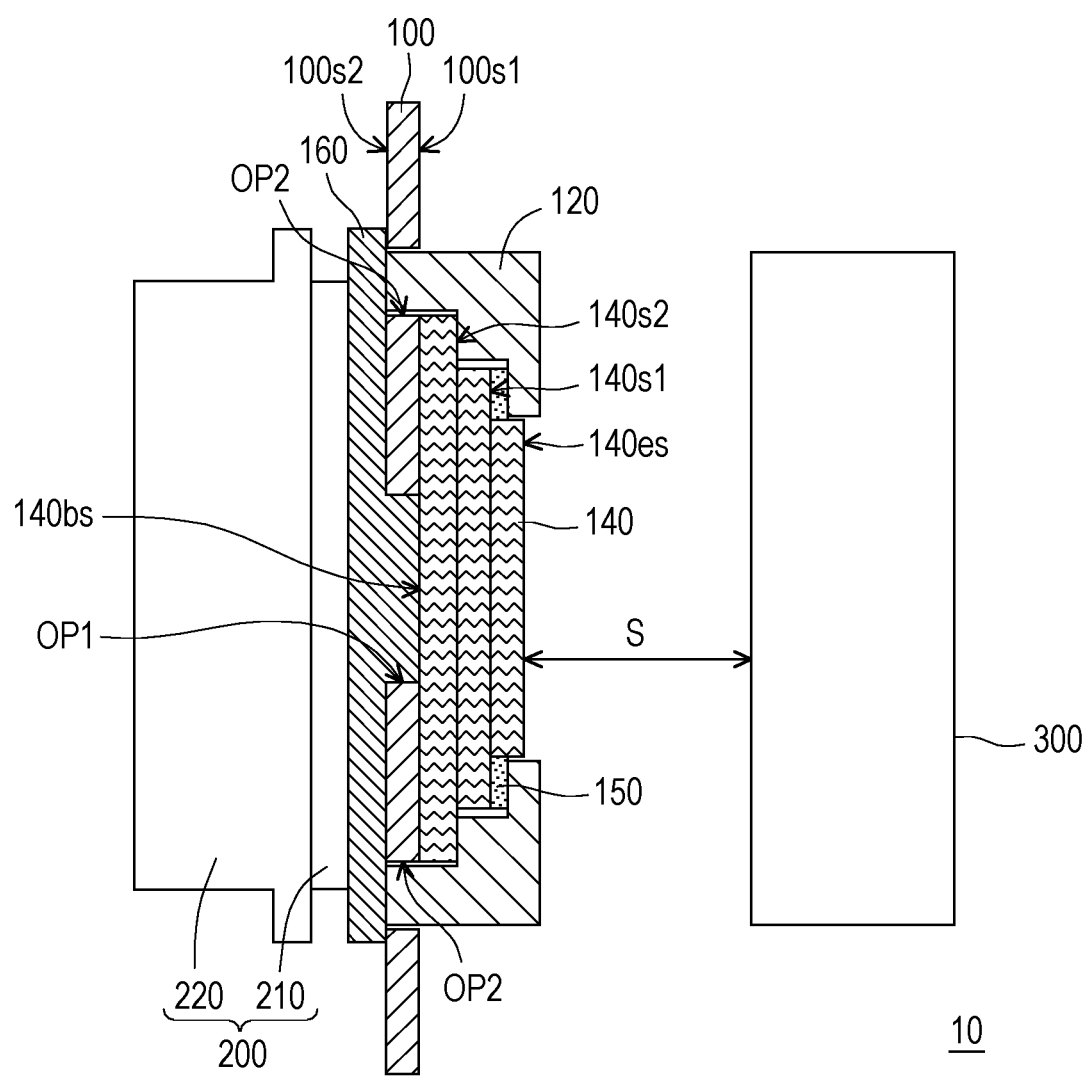
FIG. 1 is a schematic cross-sectional view of an optical engine module according to the first embodiment of the disclosure.
Figure 2:
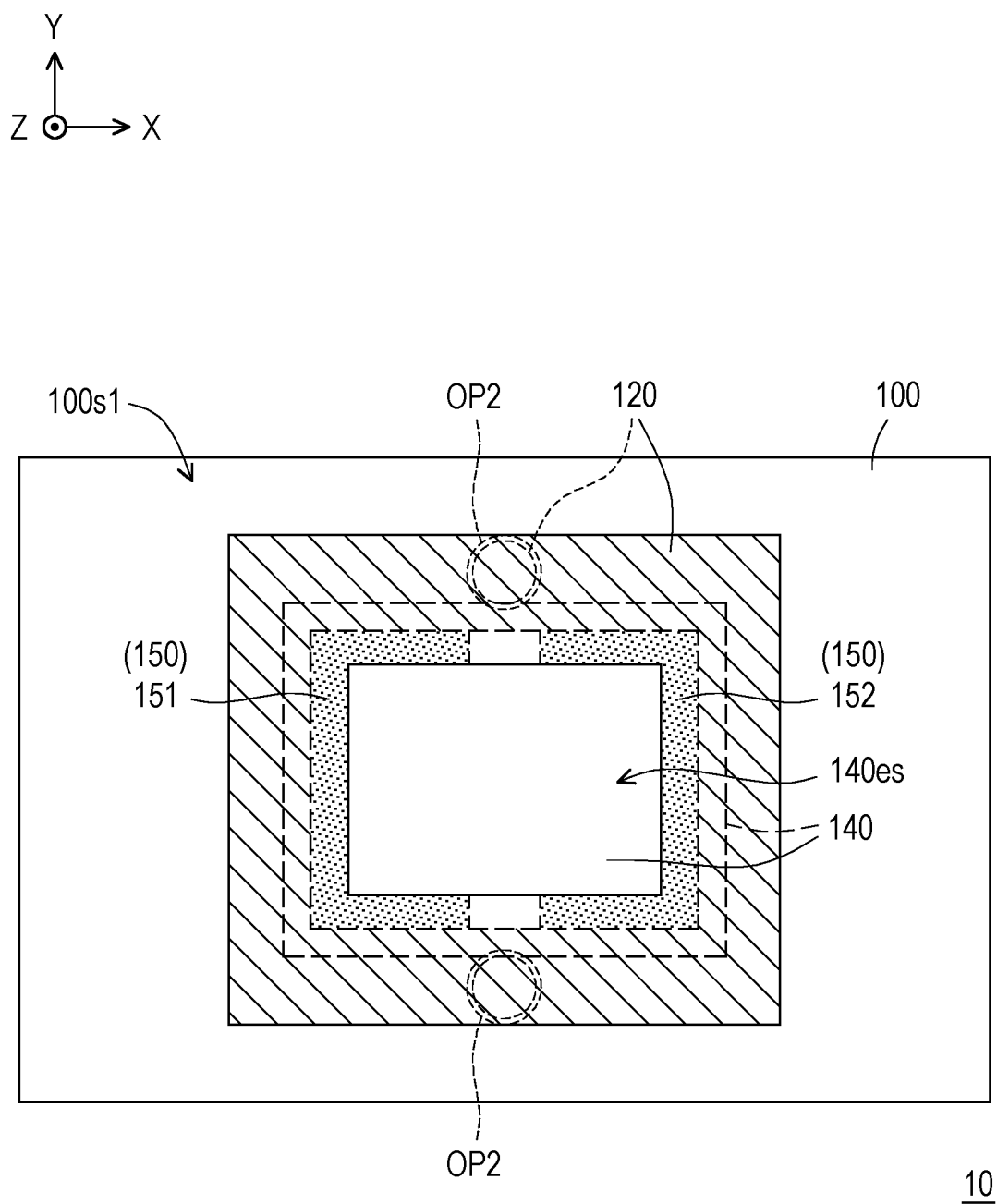
FIG. 2 is a schematic front view of the optical engine module of FIG. 1.

FIG. 1 is a schematic cross-sectional view of an optical engine module according to the first embodiment of the disclosure. FIG. 2 is a schematic front view of the optical engine module of FIG. 1. For clarity of presentation, an illustration of an optical element 300 in FIG. 1 is omitted in FIG. 2. Referring to FIGS. 1 and 2, an optical engine module 10 includes a circuit board 100, a supporting member 120, a light valve module 140, and a thermal conductive member 160. The circuit board 100 has a first surface $100s1$ and a second surface $100s2$ opposite to each other. The light valve module 140 is disposed on the first surface $100s1$ of the circuit board 100. A thermal conductive material 150 is further disposed between the light valve module 140 and the supporting member 120. The supporting member 120 is a metal material with good thermal conductivity, such as copper and aluminum. The thermal conductive material 150 is a thermal conductive interface material, such as a thermal pad or thermal grease formed by a silicon material.

The light valve module 140 is electrically connected to the circuit board 100, and has a light emitting surface $140es$ facing away from the circuit board 100 and a back surface $140bs$ opposite to the light emitting surface $140es$. A light emitting side of the light valve module 140 is defined as an area adjacent to the light emitting surface $140es$, and a back side of the light valve module 140 is defined as an area adjacent to the back surface $140bs$. The thermal conductive member 160 is disposed on the second surface $100s2$ of the circuit board 100. Through the optical element 300, the light emitting surface $140es$ of the light valve module 140 is configured to receive an illumination beam from a light source (not shown), and the illumination beam is converted into an image beam by the light valve module 140, and then reflected by the light emitting surface $140es$ to leave the light valve module 140 to the optical element 300.

In this embodiment, the light valve module 140 is, for example, a digital micro-mirror device (DMD), and a reflective surface thereof may be defined as the light emitting surface $140es$ of the light valve module 140. However, the disclosure is not limited to thereto. In other embodiments, the light valve module 140 may also be a reflective liquid-crystal-on-silicon (LCOS) panel.

It is particularly noted that the circuit board 100 further has a first opening hole OP1 penetrating through the first surface $100s1$ and the second surface $100s2$. The thermal conductive member 160 may be connected to the back surface $140bs$ of the light valve module 140 through the first opening hole OP1 of the circuit board 100 to form thermal conduction, so as to reduce an operating temperature of the back surface of the light valve module 140. In this embodiment, the optical engine module 10 may further optionally include a thermal dissipation module 200, which is disposed on one side of the second surface $100s2$ of the circuit board 100. The thermal conductive member 160 is in contact with the thermal dissipation module 200, so that heat generated during an operation of the light valve module 140 may be transferred to the thermal dissipation module 200 by means of thermal conduction. The thermal conductive member 160 is, for example, a copper sheet or other plates with good thermal conductivity.

For example, the thermal dissipation module 200 may include a thermoelectric cooler (TEC) 210 and a water-cooled thermal dissipation module 220. The thermoelectric cooler 210 is disposed and connected between the thermal conductive member 160 and the water-cooled thermal dissipation module 220. The water-cooled thermal dissipation module 220 is, for example, a flow channel including cooling water, a cold plate, or a coiled pipe. The cooling water carries heat conducted from the thermal conductive member 160 (or the thermoelectric cooler 210) to the flow channel of the cold plate or the coiled pipe to flow out the optical engine module 10, and then dissipates the heat to an outside of the optical engine module 10 by means of thermal conduction and thermal convection. However, the disclosure is not limited to thereto. In other embodiments, the thermal dissipation module 200 may also include only one of the water-cooled thermal dissipation module 220 and a thermal dissipation fin set.

In this embodiment, the supporting member 120 has a function of abutting the light valve module 140 and positioning the light valve module 140 on the circuit board 100. Since the supporting member 120 has good thermal conductivity, it may further be used as a thermal conductive structure. For example, the light valve module 140 may be partially in contact with the supporting member 120, so that the heat generated on the light emitting side of the light valve module 140 may be conducted to the thermal conductive member 160 through the supporting member 120, so as to reduce an operating temperature of the light valve module 140 on the light emitting side. Besides, the heat of the thermal conductive member 160 is suitable for being dissipated through the thermal dissipation module 200.

The circuit board 100 further has at least one second opening hole OP2. As shown in FIG. 2, in this embodiment, the circuit board 100 further has two second opening holes OP2, and the second opening holes OP2 are respectively disposed on two opposite sides of the light valve module 140. The second opening holes OP2 penetrate through the first surface 100s1 and the second surface 100s2 of the circuit board 100. The supporting member 120 may be directly connected to the thermal conductive member 160 through the second opening holes OP2 penetrating through the circuit board 100, so as to form the thermal conduction. The second opening holes OP2 may be respectively disposed on the two opposite sides of the light valve module 140 along a direction Y. However, the disclosure is not limited thereto. In other embodiments, the two second opening holes OP2 may also be disposed on the two opposite sides of the light valve module 140 along a direction X or along a diagonal direction. It should be noted that the disclosure does not limit the number and conformation of the second opening holes OP2. In other embodiments, the number and conformation of the second opening holes OP2 of the circuit board 100 may be adjusted according to different designs of thermal dissipation.

On the other hand, the light valve module 140 has a first carrying surface 140s1 and a second carrying surface 140s2 facing the supporting member 120. The thermal conductive material 150 is further disposed between the first carrying surface 140s1 of the light valve module 140 and the supporting member 120. It is particularly noted that the supporting member 120 may be in contact with the first carrying surface 140s1 of the light valve module 140 through the thermal conductive material 150, and directly in contact with the second carrying surface 140s2 of the light valve module 140 to perform thermal exchange.

Through the above configuration of the supporting member 120, the light emitting side and the back side of the light valve module 140 may be cooled by the same thermal conductive member 160. Therefore, it is possible to avoid disposing additional thermal dissipation elements (such as the thermoelectric cooler or thermal dissipation fins) or thermal dissipation modules (such as water-cooled or air-cooled thermal dissipation modules) on the light emitting side of the light valve module 140. In other words, a space occupied by a thermal dissipation structure on the light emitting side of the light valve module 140 may be reduced, which helps to reduce the complexity of a design of an optical path and the production cost of the optical engine module. For example, the optical engine module 10 is provided with the optical element 300 on one side of the light emitting surface 140es of the light valve module 140. The optical element 300 is, for example, a prism or a lens. The optical element 300 is disposed in front of the light emitting surface 140es of the light valve module 140 along a direction Z, and a distance S between the light emitting surface 140es and the optical element 300 may be less than or equal to 4 mm. In this way, the integration of the optical engine module 10 in various application devices (such as a projector) may be increased, and a volume of the optical engine module may be reduced. The disclosure is not limited thereto.

On the other hand, in this embodiment, the number of the thermal conductive materials 150 of the optical engine module 10 may be two, such as a thermal conductive material 151 and a thermal conductive material 152, as shown in FIG. 2. The two thermal conductive materials 150 are structurally separated from each other, and an orthographic projection on the first surface 100s1 of the circuit board 100 surrounds an orthographic projection of the light emitting surface 140es of the light valve module 140 on the first surface 100s1. However, the disclosure is not limited thereto.

Figure 3:
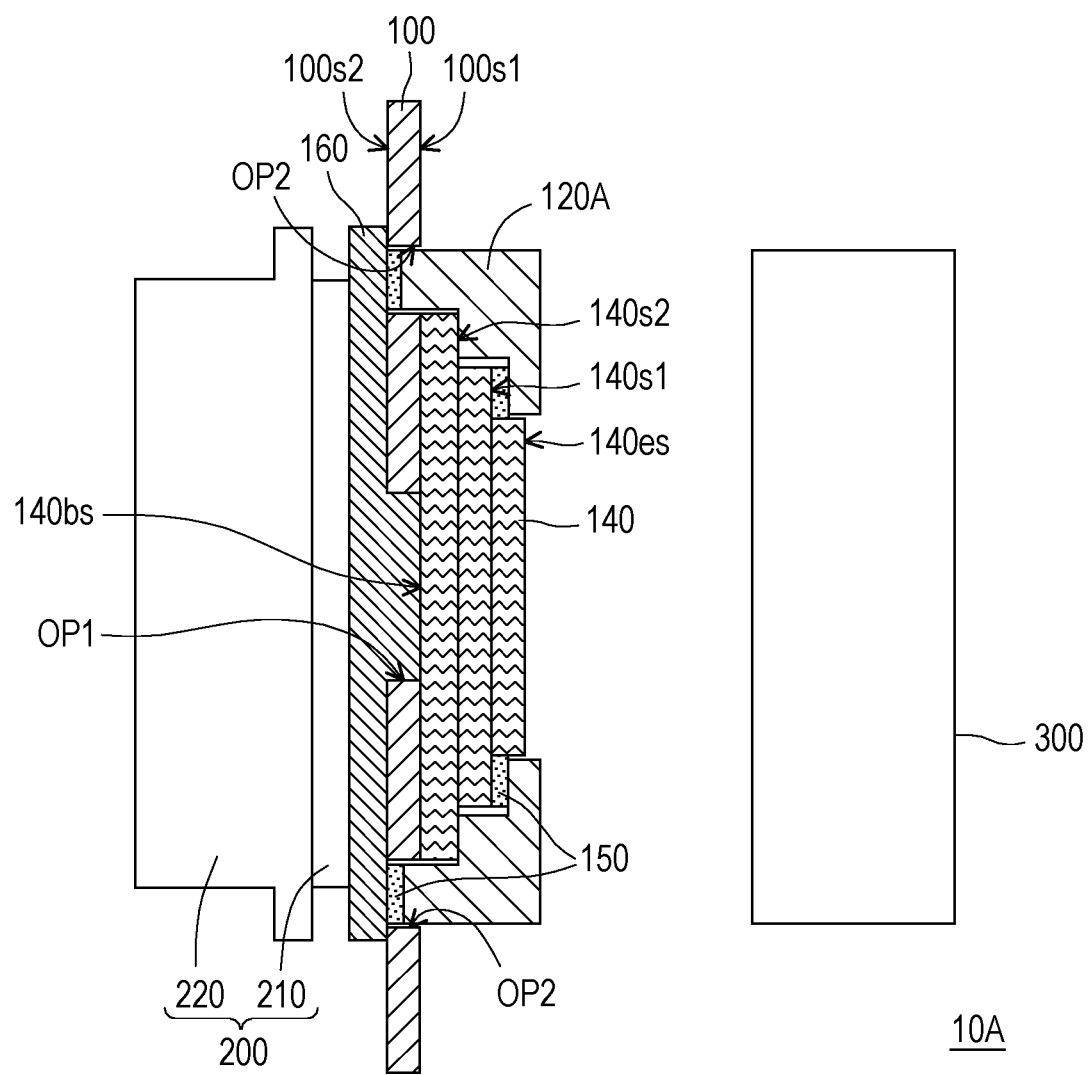
FIG. 3 is a schematic cross-sectional view of an optical engine module according to the second embodiment of the disclosure.

FIG. 3 is a schematic cross-sectional view of an optical engine module according to the second embodiment of the disclosure. Referring to FIG. 3, in another embodiment, another thermal conductive material 150 (as shown in FIG. 3) may also be disposed between a supporting member 120A and the thermal conductive member 160 of an optical engine module 10A. In other words, the supporting member 120A of the optical engine module 10A may perform the thermal exchange with the thermal conductive member 160 through the another thermal conductive material 150. In another embodiment that is not shown, the another thermal conductive material 150 may also be disposed between the supporting member 120 and the second carrying surface 140s2 of the light valve module 140, and the supporting member 120 may perform the thermal exchange with the first carrying surface 140s1 and the second carrying surface 140s2 of the light valve module 140 through the thermal conductive materials 150.

Some other embodiments are provided below to describe the disclosure in detail, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 4:
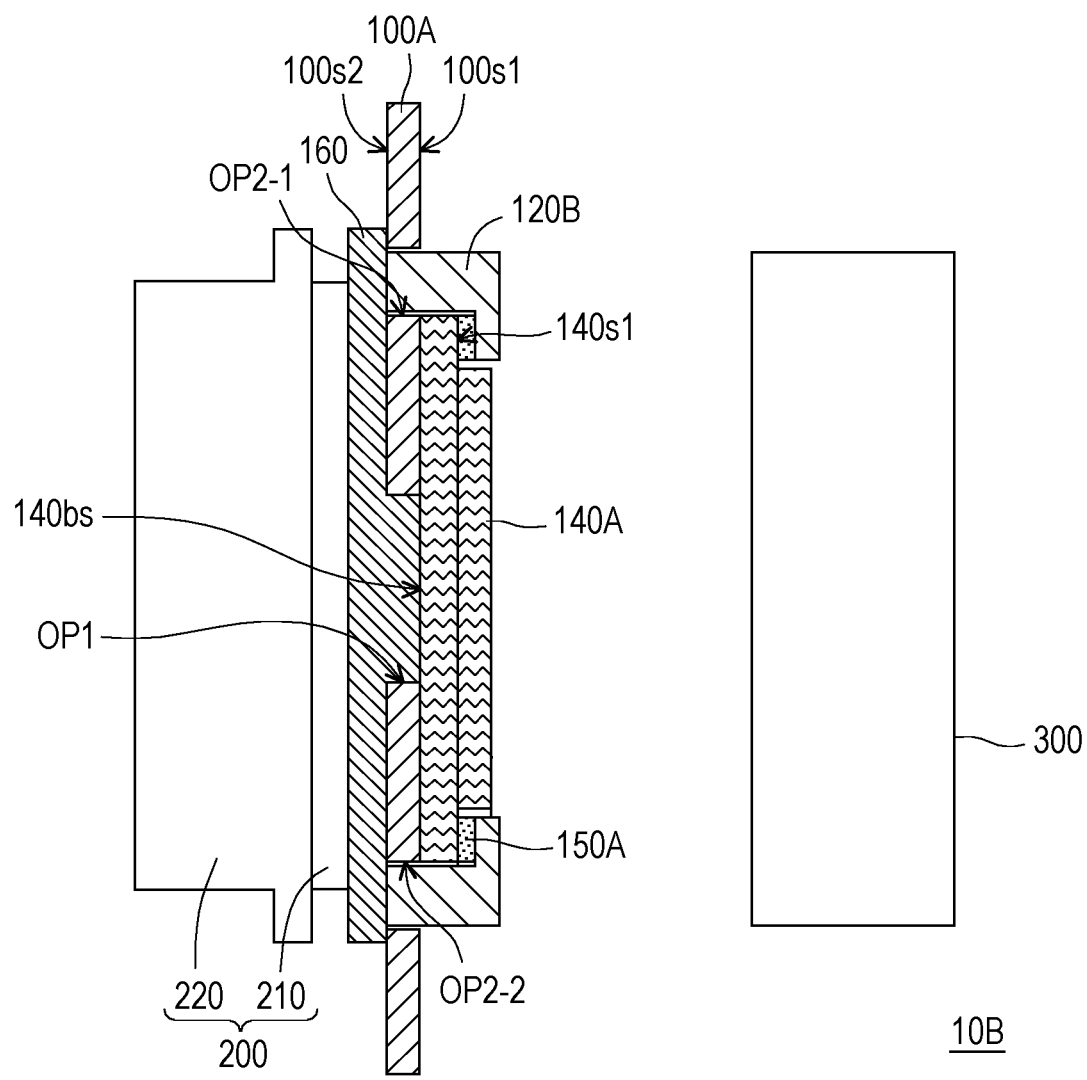
FIG. 4 is a schematic cross-sectional view of an optical engine module according to the third embodiment of the disclosure.
Figure 5:
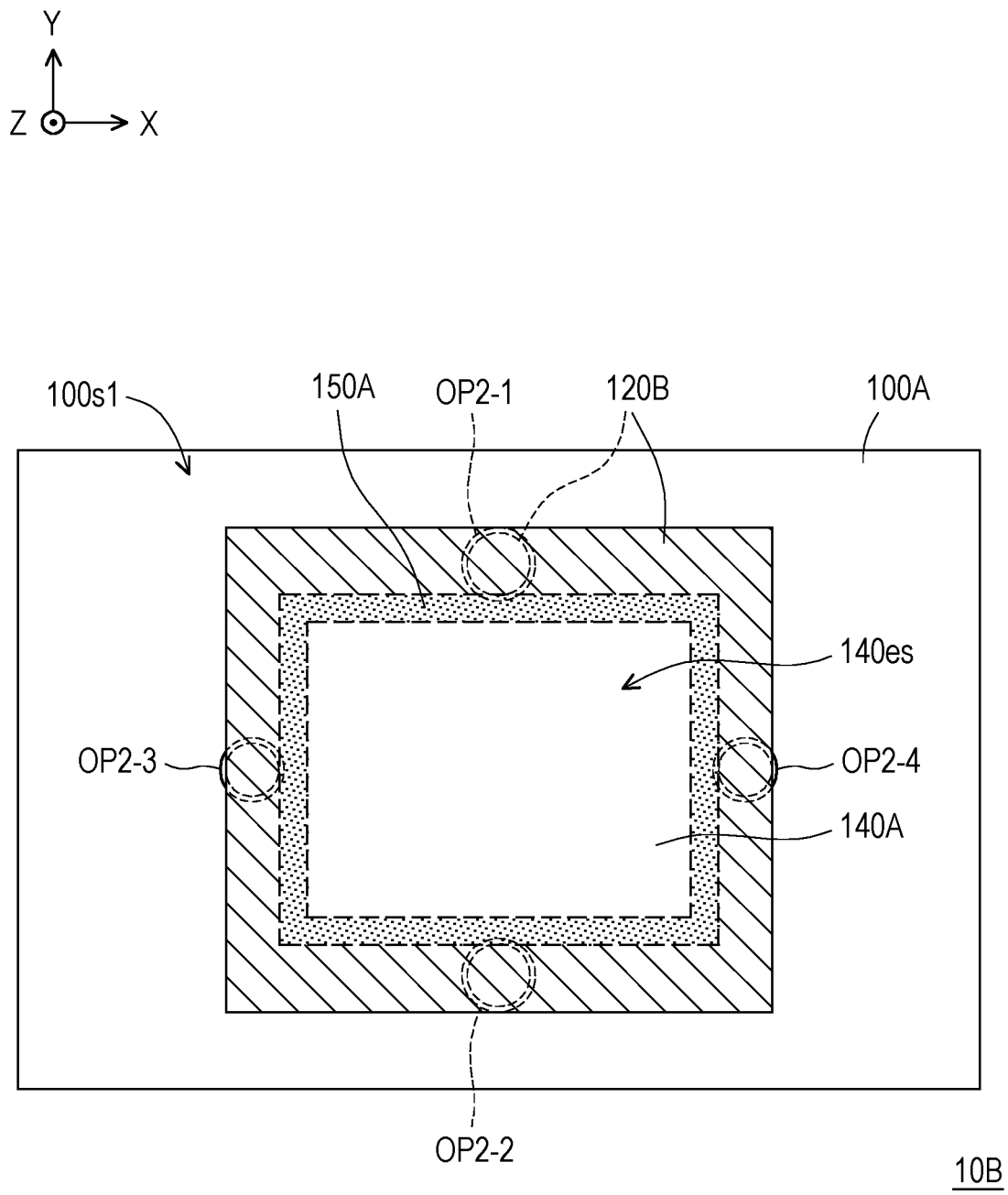
FIG. 5 is a schematic front view of the optical engine module of FIG. 4.

FIG. 4 is a schematic cross-sectional view of an optical engine module according to the third embodiment of the disclosure. FIG. 5 is a schematic front view of the optical engine module of FIG. 4. For clarity of presentation, the illustration of the optical element 300 in FIG. 4 is omitted in FIG. 5. Referring to FIGS. 4 and 5, a difference between an optical engine module 10B of this embodiment and the optical engine module 10 of FIG. 1 is that a conformation of the light valve module, a configuration of the thermal conductive material, and the number of the second opening holes of the circuit board are different.

Specifically, a light valve module 140A of this embodiment does not have the second carrying surface 140s2 of the light valve module 140 in FIG. 1. In other words, a supporting member 120B is not directly in contact with the light valve module 140A, but only perform the thermal exchange with the light valve module 140A through a thermal conductive material 150A. In this embodiment, an orthographic projection of the thermal conductive material 150A on the first surface 100s1 of the circuit board 100 continuously surrounds an orthographic projection of the light emitting surface 140es of the light valve module 140A on the first surface 100s1.

On the other hand, in this embodiment, the number of the second opening holes of a circuit board 100A is four, which are respectively a second opening hole OP2-1 and a second opening hole OP2-2 disposed on two opposite sides of the light valve module 140A along the direction Y, and a second opening hole OP2-3 and a second opening hole OP2-4 disposed on the two opposite sides of the light valve module 140A along the direction X. It is particularly noted that the supporting member 120B is in thermal contact with the thermal conductive member 160 through the second opening holes of the circuit board 100A. Therefore, a light emitting side and a back side of the light valve module 140A may be cooled by the same thermal conductive member 160. In this way, it is possible to avoid disposing additional thermal dissipation elements (such as the thermoelectric cooler or thermal dissipation fins) or thermal dissipation modules (such as the water-cooled or air-cooled thermal dissipation modules) on the light emitting side of the light valve module 140A, which helps to reduce the space occupied by the thermal dissipation structure on the light emitting side of the light valve module 140A, thereby reducing the complexity of the design of the optical path and the production cost of the whole optical engine.

Figure 6:
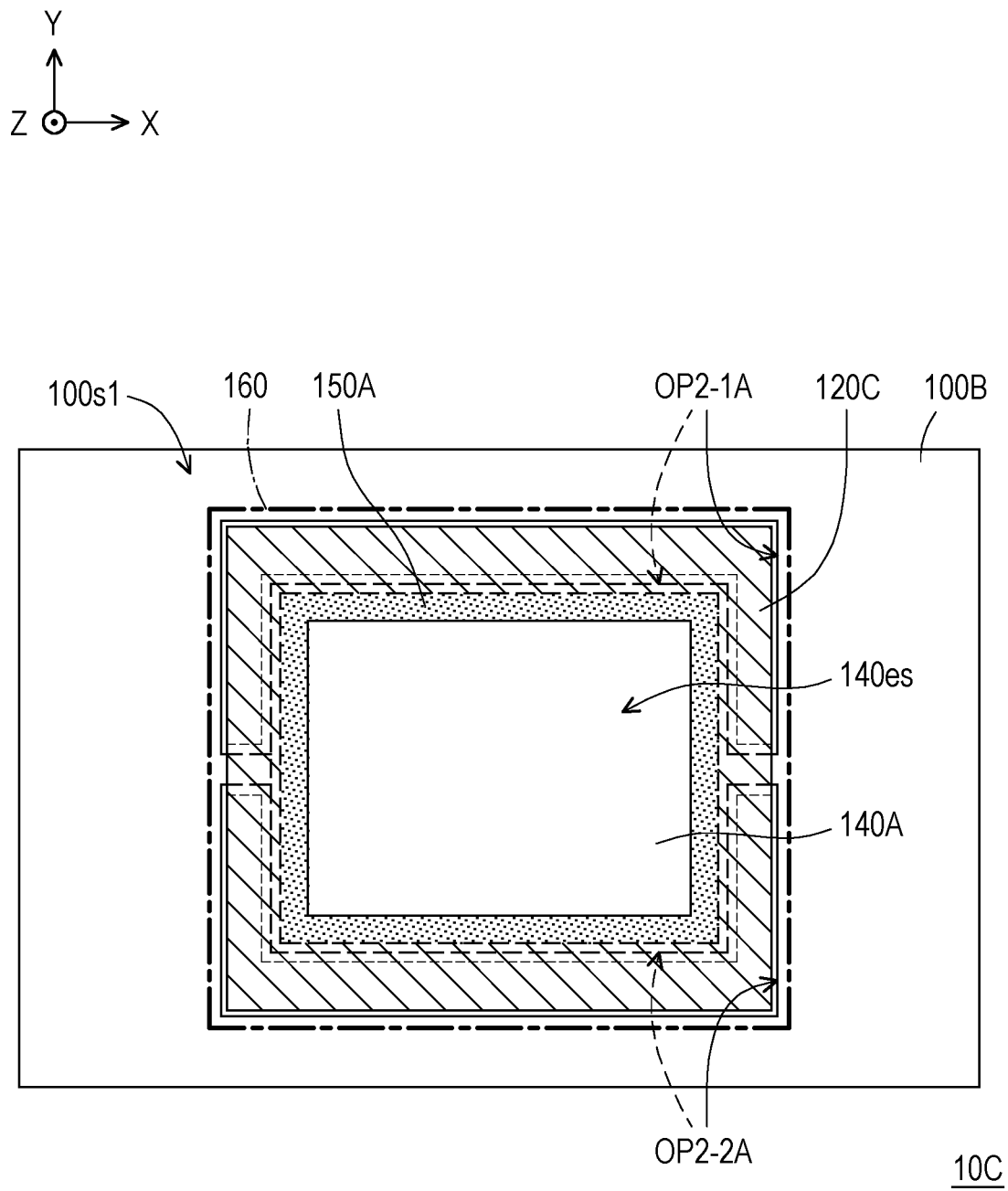
FIG. 6 is a schematic front view of an optical engine module according to the fourth embodiment of the disclosure.

FIG. 6 is a schematic front view of an optical engine module according to the fourth embodiment of the disclosure. Referring to FIG. 6, a difference between an optical engine module 10C of this embodiment and the optical engine module 10B of FIG. 5 is that a configuration of the second opening holes of the circuit board is different. Specifically, an orthographic projection of an area occupied by a second opening hole OP2-1A and a second opening hole OP2-2A of a circuit board 100B of the optical engine module 10C on the first surface 100s1 of the circuit board 100B surrounds the orthographic projection of the light emitting surface 140es of the light valve module 140A on the first surface 100s1. Accordingly, a contact area between a supporting member 120C and the thermal conductive member 160 may be increased, which helps to further improve the effect of thermal dissipation of the light valve module 140A on the light emitting surface 140es.

Since the supporting member 120C is in thermal contact with the thermal conductive member 160 through the second opening holes of the circuit board 100B, the light emitting side and the back side of the light valve module 140A may be cooled by the same thermal conductive member 160. In this way, it is possible to avoid disposing additional thermal dissipation elements (such as the thermoelectric cooler or thermal dissipation fins) or thermal dissipation modules (such as the water-cooled or air-cooled thermal dissipation modules) on the light emitting side of the light valve module 140A. In other words, the space occupied by the thermal dissipation structure on the light emitting side of the light valve module 140A may be reduced, which helps to reduce the complexity of the design of the optical path and the production cost of the whole optical engine.

Figure 7:
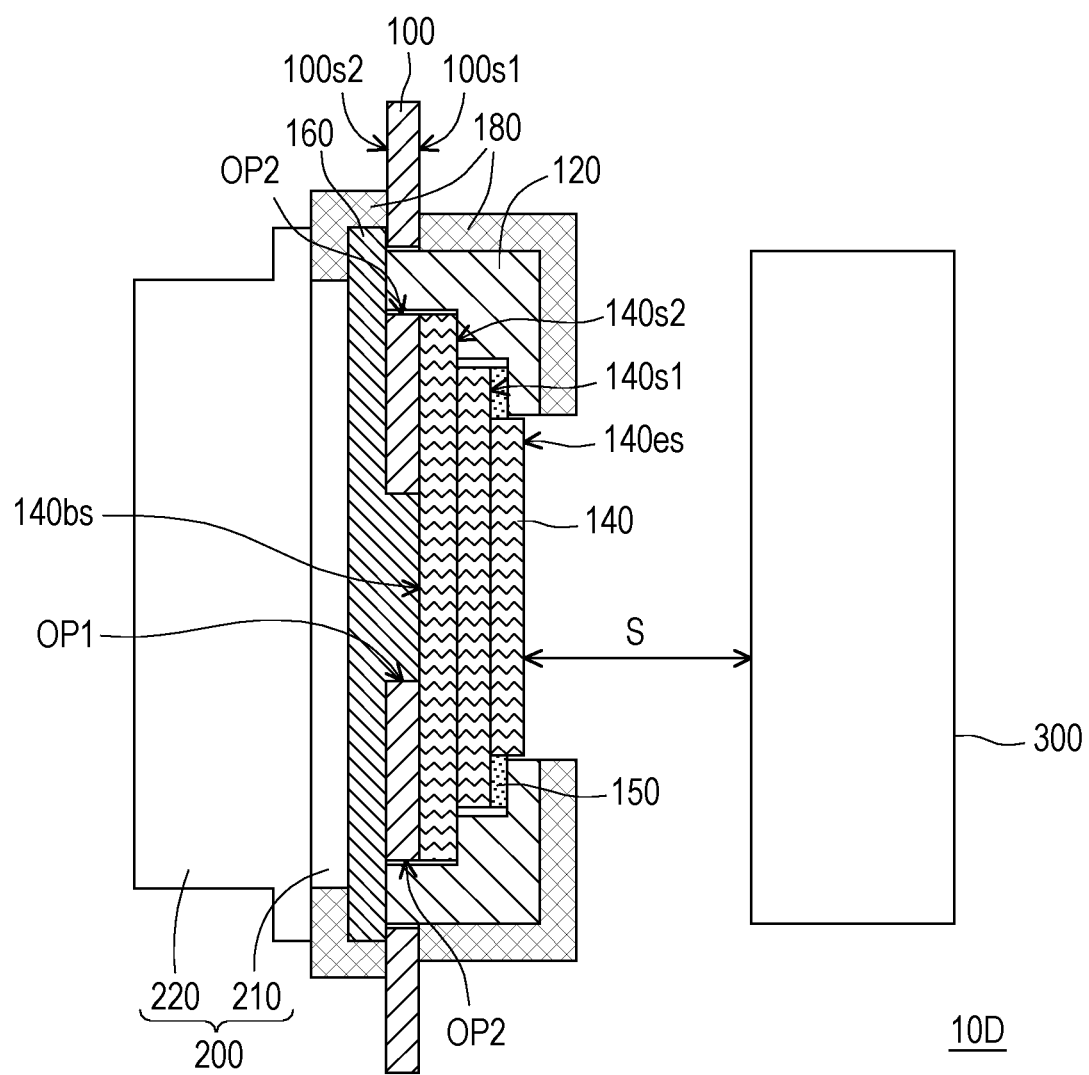
FIG. 7 is a schematic cross-sectional view of an optical engine module according to the fifth embodiment of the disclosure.

FIG. 7 is a schematic cross-sectional view of an optical engine module according to the fifth embodiment of the disclosure. Referring to FIG. 7, a difference between an optical engine module 10D of this embodiment and the optical engine module 10 of FIG. 1 is that the optical engine module 10D further includes an anti-condensation structure 180. In this embodiment, when the thermal conductive member 160 and the supporting member 120 have a lower temperature, the anti-condensation structure 180 may be configured to cover the thermal conductive member 160 and the supporting member 120 to isolate the contact of the external high-humidity air, thereby avoiding condensation on surfaces of the thermal conductive member 160 and the supporting member 120 and affecting the normal operation of the light valve module 140. However, the disclosure is not limited to thereto. In other embodiments, the anti-condensation structure may only be disposed on one side of the circuit board 100, and the anti-condensation structure covers the thermal conductive member 160 or the supporting member 120. In this embodiment, the anti-condensation structure 180 may be formed by a sponge or rubber. However, the disclosure is not limited thereto.

Based on the above, in the optical engine module according an embodiment of the disclosure, the thermal conductive member is disposed on one side of the circuit board facing away from the light valve module, and is in thermal contact with the back surface of the light valve module through the first opening hole of the circuit board. In order to reduce the temperature difference between the light emitting side and the back side of the light valve module, the supporting member located on the light emitting side of the light valve module is in thermal contact with the thermal conductive member through the second opening hole of the circuit board. The light emitting side and the back side of the light valve module is cooled by the same thermal conductive member. Therefore, the space occupied by the thermal dissipation structure on the light emitting side of the light valve module may be reduced, which helps to reduce the complexity of the design of the optical path and the production cost of the whole optical engine.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An optical engine module, comprising: a circuit board, a light valve module, a thermal conductive member, and a supporting member, wherein the circuit board has a first surface, a second surface opposite to the first surface, a first opening hole and at least one second opening hole, the first opening hole and the at least one second opening hole are separately disposed at the circuit board, the first opening hole penetrates through the first surface and the second surface and the at least one second opening hole penetrates through the first surface and the second surface;

the light valve module is disposed on the first surface and is electrically connected to the circuit board, and the light valve module has a light emitting surface and a back surface opposite to the light emitting surface;

the thermal conductive member is disposed on the second surface of the circuit board, and a part of the thermal conductive member is thermally connected to the back surface of the light valve module through the first opening hole of the circuit board; and the supporting member is disposed on one side of the first surface of the circuit board, the supporting member is partially in contact with the light valve module and at least one portion of the supporting member extends into the at least one second opening hole of the circuit board along an extending direction and is thermally connected to a plane of the thermal conductive member disposed on the second surface of the circuit board, wherein the plane of the thermal conductive member is perpendicular to the extending direction, wherein an orthogonal projection of the at least one second opening hole on the plane of the thermal conductive member is overlapped with an orthogonal projection of the at least one portion of the supporting member on the plane of the thermal conductive member.

2. The optical engine module according to claim 1, wherein the at least one second opening hole is a plurality of second opening holes, and the plurality of second opening holes are respectively disposed on two opposite sides of the light valve module in at least one direction.

3. The optical engine module according to claim 1, wherein the at least one second opening hole is two second opening holes, and an orthographic projection of an area occupied by the two second opening holes on the first surface surrounds an orthographic projection of the light emitting surface of the light valve module on the first surface.

4. The optical engine module according to claim 1, wherein the light valve module further has at least one carrying surface facing the supporting member, and the at least one carrying surface is parallel to the light emitting surface.

5. The optical engine module according to claim 4, further comprising:

at least one thermal conductive material disposed between the light valve module and the supporting member, wherein the at least one carrying surface comprises a first carrying surface, and the supporting member is in thermal contact with the first carrying surface of the light valve module through the at least one thermal conductive material.

6. The optical engine module according to claim 5, wherein an orthographic projection of the at least one thermal conductive material on the first surface continuously surrounds an orthographic projection of the light emitting surface of the light valve module on the first surface.

7. The optical engine module according to claim 5, wherein the at least one thermal conductive material is a plurality of thermal conductive materials separated from each other, and an orthographic projection of the plurality of thermal conductive materials on the first surface surrounds an orthographic projection of the light emitting surface of the light valve module on the first surface.

8. The optical engine module according to claim 5, wherein the at least one carrying surface further comprises a second carrying surface, and the supporting member is directly in thermal contact with the second carrying surface.

9. The optical engine module according to claim 1, further comprising:

an optical element disposed on one side of the light emitting surface of the light valve module and overlapping the light emitting surface, wherein a distance between the optical element and the light emitting surface is less than or equal to 4 mm.

10. The optical engine module according to claim 1, further comprising:

a thermal dissipation module disposed on one side of the second surface of the circuit board and is in contact with the thermal conductive member, wherein heat of the thermal conductive member is suitable for being dissipated through the thermal dissipation module.

11. The optical engine module according to claim 1, further comprising:

at least one thermal conductive material disposed between the thermal conductive member and the supporting member, wherein the supporting member is in thermal contact with the thermal conductive member through the at least one thermal conductive material.

12. The optical engine module according to claim 1, further comprising:

an anti-condensation structure disposed on at least one side of the circuit board and covering at least one of the thermal conductive member and the supporting member.

* * * * *